United States Patent
Levine et al.

(10) Patent No.: US 7,507,914 B2
(45) Date of Patent: Mar. 24, 2009

(54) MICRO-CASTELLATED INTERPOSER

(75) Inventors: Aaron Levine, Rio Rancho, NM (US); Jay D. Stanke, Albuquerque, NM (US)

(73) Assignee: Honeywell International Inc., Morristown, NJ (US)

( * ) Notice: Subject to any disclaimer, the term of this patent is extended or adjusted under 35 U.S.C. 154(b) by 446 days.

(21) Appl. No.: 11/136,120

(22) Filed: May 24, 2005

(65) Prior Publication Data

US 2006/0000638 A1    Jan. 5, 2006

Related U.S. Application Data

(60) Provisional application No. 60/584,025, filed on Jun. 30, 2004.

(51) Int. Cl.
*H05K 1/16* (2006.01)
(52) U.S. Cl. .................... 174/260; 174/261; 174/262
(58) Field of Classification Search ......... 174/262–266, 174/260–261; 361/792–795
See application file for complete search history.

(56) References Cited

U.S. PATENT DOCUMENTS

| | | | |
|---|---|---|---|
| 4,907,128 A * | 3/1990 | Solomon et al. ............ 361/736 |
| 5,069,626 A | 12/1991 | Patterson et al. |
| 5,247,423 A | 9/1993 | Lin et al. |
| 6,144,090 A | 11/2000 | Higashiguchi ............... 257/693 |
| 6,377,464 B1 | 4/2002 | Hashemi et al. |
| 6,534,726 B1 * | 3/2003 | Okada et al. ................. 174/263 |
| 6,609,915 B2 | 8/2003 | Adams et al. |
| 6,862,190 B2 * | 3/2005 | Olzak et al. ................. 361/768 |
| 2001/0032740 A1 | 10/2001 | Kennedy et al. ............ 174/262 |

FOREIGN PATENT DOCUMENTS

EP    0 948 049 A1    6/1999

OTHER PUBLICATIONS

Patent Abstracts of Japan, vol. 015, No. 383 (E-1116), Sep. 27, 1991 & JP 03 152994 A (NEC Corp), Jun. 28, 1991.
International Search Report for PCT/US2005/023270 dated Jul. 19, 2006.

* cited by examiner

*Primary Examiner*—Jeremy C Norris
(74) *Attorney, Agent, or Firm*—McDonnell Boehnen Hulbert & Berghoff LLP

(57) ABSTRACT

A miniature PWB with features that incorporate the required circuitry changes and component footprints, which has been enhanced with micro-castellations such as those found on ceramic surface mount packages. The miniature PWB is mounted on the circuit board using techniques well known in the art. This combination of technologies provides an adaptable, durable interconnect methodology, which allows for circuit and part changes without changing the layout of the base printed wiring board.

7 Claims, 5 Drawing Sheets

MICRO-CASTELLATED INTERPOSER

CROSS-REFERENCE TO RELATED APPLICATIONS

This application is based on U.S. Provisional Application Ser. No. 60/584,025 entitled "Micro Castellated Interposer", filed on Jun. 30, 2004, the teachings of which are incorporated herein by reference.

BACKGROUND OF THE INVENTION

1. Field of the Invention (Technical Field):

The present invention relates to packaging of highly reliable, high-speed complex electronics, and more particularly to a method and apparatus for reworking circuits using a micro-castellated interconnect board with its related electrical parts and affixing it to the circuitry.

2. Background Art

As electronic devices get smaller and smaller the prior art methods of part substitution and repair of circuitry create errors on existing hardware and become very problematic, if not entirely troublesome. Repair of circuitry and rewiring of devices on high-speed circuitry needs to be manufacturable and to a great extent electrically identical and meet environmental requirements of the product's end use. The present invention addresses a method for incorporating these changes to surface mounted electronics.

An existing prior art device or method uses a custom hybrid part, which internally incorporates the electrical wiring changes with mount die(s) containing the affected parts and provides environmental protection for the electronics. Such a custom part is very expensive, requires extensive lead-time and is not compliant to the volume allocated to the existing electronics. This method is not adequate for an individual revision as it is cost prohibitive. It can only be utilized for multiple or similar revisions to a large quantity of printed wiring boards (PWB's).

Another prior art method is to scrap existing product circuit cards, re-layout the electronics, and procure new printed wiring boards and components. Other methods include reworking the circuit card assembly, usually called "dead bugging" of components and "cut and jumpering" of circuitry relying on highly skilled operators and requiring the visual aid of a microscope to complete. Presently, the accepted practice for military electronics is defined by standards for "cut and jumpering" of traces.

Scrapping product and re-layout of circuitry is costly and often causes delays in build schedules. Manual rework is not exact, is prone to human error and adds additional expense due to the use of highly skilled labor. Additionally, some product still gets scrapped due to damage during repair and the rework is not precise and may introduce variability in electrical integrity.

State of the art approaches have been relatively successful until the current generation of smaller geometry, high-speed electronic parts. Smaller parts require higher skill and use of magnification aids. As parts get smaller, the manual repair and replacement of parts becomes harder and at some point impossible due to human limitations. Higher speeds require more exact electrical wiring lengths and electrical trace separation. Depending upon the extent of the change, current approaches utilize additional adhesive to adhere part and wires to the circuit card assembly.

A re-layout of the base circuit board can accomplish the same function, that of rewiring, accommodating part changes and providing high reliability, however this approach would be extremely expensive. Additionally, this method may introduce additional errors in re-layout of complex very high-density circuitry by rerouting of critical signals. Other devices, such as individual parts can accomplish one of the desired outcomes but not all three, wiring changes, part changes, and high reliability.

There are several prior art documents that disclose castellations and/or outer land grid pads however, they do not address any context of providing a durable interconnect containing the combination of substrate design/materials, pad geometries, and castellation matched to the parent printed wiring board. Additionally, the intent of utilizing existing parent printed wiring board circuitry and providing changed electrical functionality that is both manufacturable and low cost is not addressed in any of the prior art.

These prior art documents include U.S. Pat. No. 6,609,915 B2 which discloses a piece that only forms the interconnect between a multichip module and the parent printed wring board. The present invention performs that function as well as providing new circuitry and mounting of parts and addresses the durability of the interconnect.

U.S. Pat. No. 6,377,464 B1 is a device which may have castellations for termination, but does not address durability of the interconnect. In fact, the method described for constellating a part lacks features, which could provide the necessary durability, namely bottom pads.

U.S. Pat. No. 5,247,423 has ½ vias which form periphery castellations allowing leads, wires or solder filled springs, to be attached and provide the interconnect to the parent printed wiring board. The present invention is a durable leadless interconnect.

U.S. Pat. No. 5,069,626 is a molded plastic device, which is molded to allow plating of castellations, which have additional geometry attachment to the parent printed wiring board. While it mentions that the individual "castellations area able to flex (on a microscopic level)" and it allows that the molded material may be matched to the "second component" it does not address how the castellations really flex and if this would be of any benefit to the level of stresses induced due to thermal coefficient of expansion mismatch, not to mention differential heating and cooling. Unless there is major accommodation in the mounting structure, aka flexibility, the solder joint geometry is critical to sustaining the thermally induced strains to meet the necessary durability.

None of the prior art documents teach or disclose the combination of substrate design/materials, pad and castellation geometries, which allow the formation of a robust solder joint. Additionally, the prior art fails to disclose the utilization of existing parent printed wiring board circuitry and providing changed electrical functionality that is both manufacturable and low cost.

SUMMARY OF THE INVENTION (DISCLOSURE OF THE INVENTION)

The present invention forms a robust methodology for accommodating part and/or circuitry changes to an existing printed wiring board while allowing for automated assembly. It provides these capabilities without incorporation of additional hardware, namely leads or flexible circuitry. It also allows a method for accommodating parts, materials and geometries that are disparate with the parent's materials and geometries.

A primary object of the present invention is to provide a micro castellated interposer, which has the ability to accommodate different wiring paths, part changes and/or new parts and maintain the original high level of reliability of the circuit board assembly.

A primary advantage of the present invention is that it provides a means for circuitry and part changes at the lowest cost with the highest reliability without compromising performance.

Other objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several embodiments of the present invention and, together with the description, serve to explain the principles of the invention. The drawings are only for the purpose of illustrating a preferred embodiment of the invention and are not to be construed as limiting the invention. In the drawings.

DESCRIPTION OF THE PREFERRED EMBODIMENTS

Best Modes For Carrying Out The Invention

The present invention comprises a small but common printed circuit board, which can be manufactured with conventional high precision techniques. The layout of this printed circuit board, which can be done in-house to accommodate interface data from the parent circuit card assembly, uses standard trace routing and interconnect (through-holes) found in printed circuit applications. Exact shape, layering and interconnect are determined at the time of laying out the circuitry. Replacement parts and additional parts are incorporated into the circuitry. The micro-castellations which will subsequently interconnect the micro-castellated interconnect board to its parent are placed to optimize circuitry issues while ensuring a robust solder joint which provides the interconnect. Manufacturing methods for the micro-castellated features may vary depending upon the design intent. This design once completed is panelized to provide fabrication efficiency for the circuit board house and enable a multiple up build of micro-castellated circuits on the manufacturing floor. Once fabricated the panelized micro-castellated circuits are built up with parts using standard high precision surface mount assembly methods and machines to form micro-castellated assemblies. These individual assemblies are then separated and are available for stocking or use on the parent assembly. The design of these castellated "leadless" solder joints comprises two distinct stress areas. One area is the pad to pad region commonly called the foot of the solder joint, which is relatively thin and is stressed predominately by sheering forces. The other area known as the toe is the solder that forms a fillet between the castellated solder joint and the remaining pad area. This region serves as a pseudo column and significantly adds to the life of the solder joint. The second assembly operation with the parent assembly is also an automated process again using standard high precision surface mount assembly methods and machines.

Figure 1:
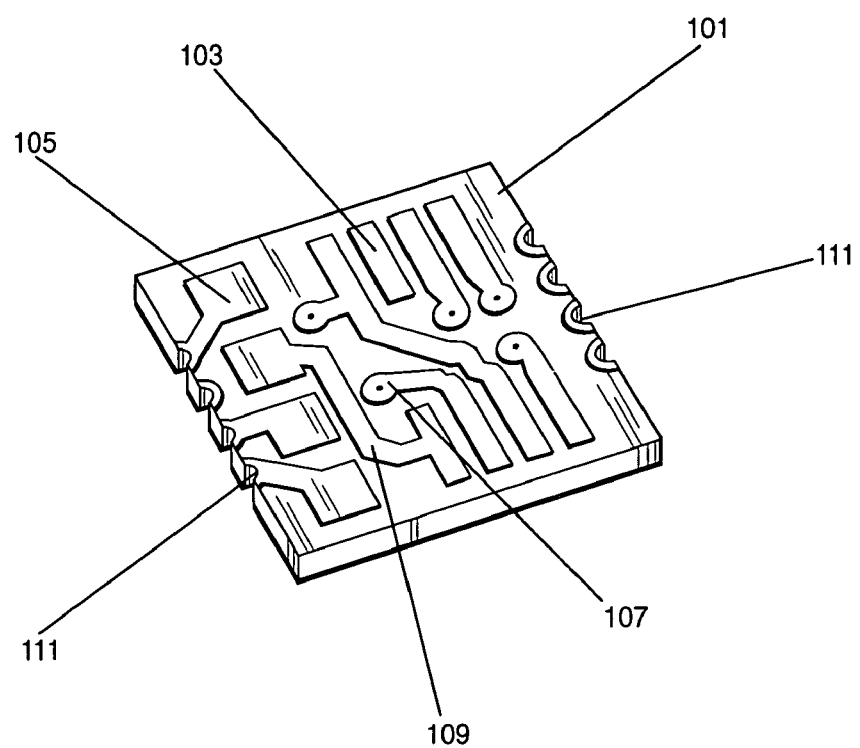
FIG. 1 shows the preferred embodiment of the micro-castellated printed wiring board.
Figure 3:
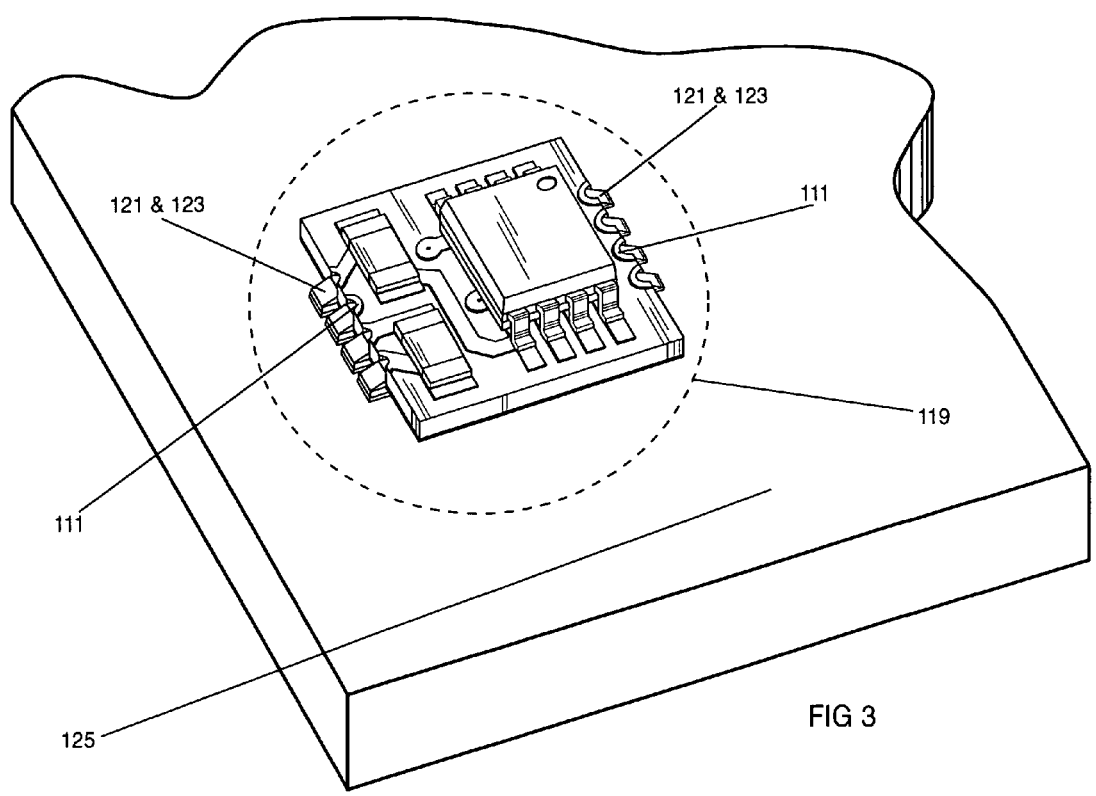
FIG. 3 shows the embodiment of FIG. 2 mounted on a parent board.

The novel micro-castellated printed wiring board is shown in FIG. 1, where printed wiring board 101 is designed and fabricated by common but high precision printed wiring board tools and methods producing fine features 103. These fine features 103 can include pads for mounting components 105, traces for top and bottom interconnect 109, and through-hole vias 107 for interconnecting layers. Artwork may include intermediate layers for shielding and interconnect depending upon the complexity of the electrical circuitry (not shown). Printed wiring board 101 includes micro-castellated through-hole vias 111 that form the micro-castellated solder joints 123 (FIG. 3) and interconnect to bottom surface pads 121 (FIG. 3). These micro-castellated vias 111 are designed to align with surface features on the parent printed wring board 125 (FIG. 3).

Figure 2:
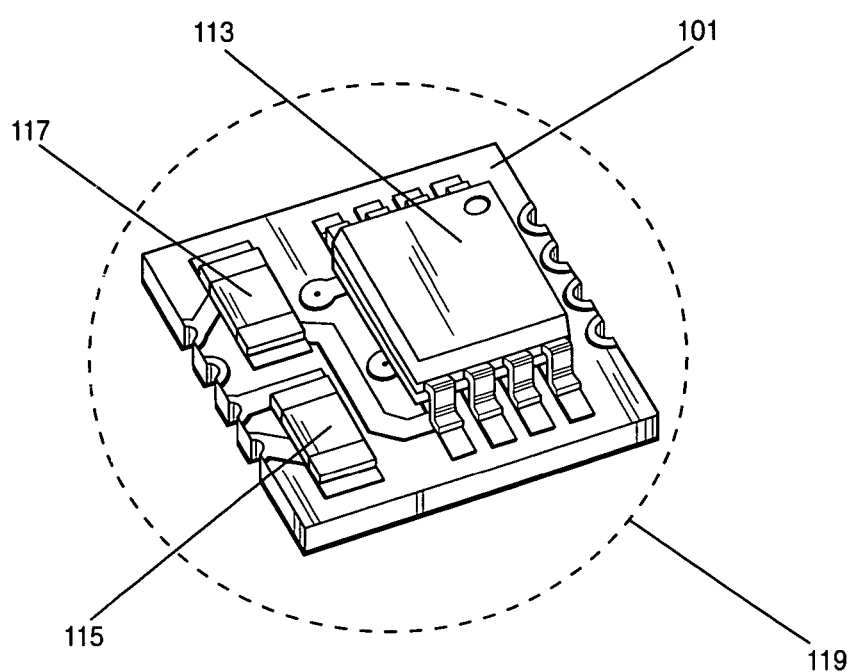
FIG. 2 shows the embodiment of FIG. 1 populated with components.

In FIG. 2, the micro-castellated printed wiring board 101 is populated with changed circuitry devices, such as a microcircuits 113, resistors 115, and/or capacitors 117. These devices are soldered to the micro-castellated printed wiring board 101 making the micro-castellated circuit card assembly 119. This micro-castellated circuit assembly 119 embodies the replacement circuitry for parent printed wiring board 125.

In FIG. 3 the micro-castellated circuit card assembly 119 is mounted on the parent printed wiring board 125. The micro-castellations 111 are soldered directly to the surface pads 121 forming robust leadless surface mount solder joints 123. The robustness of the solder joints results from choosing the correct material properties for the micro-castellated interposer, designing the castellations/pad geometry in relation to the current parent pad geometry to form adequate solder joints/fillets and designing pad geometry to accommodate part geometries. The materials include the selection of printed wiring board materials whose properties account for a coefficient of expansion differences between the mounted parts and the parent printed wiring board. Solder durability analysis of the geometries and materials is performed in the design stage to ensure that the micro-castellated interposer provides robust solder joints for the parts as well as the interconnect to the parent printed wiring board. These include a pad to castellation geometry ratio, which ensures that the resultant solder geometry is capable of accommodating thermal induced stresses between parts, the micro-castellated printed wiring board and the parent printed wiring board. In addition, the manufacturing method includes supplying the correct solder volume to produce the correct geometry solder joint.

For example if the parent printed wiring board is made of commercial woven E-glass/epoxy with a coefficient of expansion (CTE) of 15 (parts per million/degree Celsius) and the new parts to be added to the circuitry are ceramic parts with CTE of 7 (ppm/° C.), then the Micro-castellated Interposer board would preferably be designed out of woven aramid/multi-functional epoxy with a CTE in between the parts and the parent printed wiring board. In this way the necessary interconnect strength could be accommodated from the as designed pad/castellation geometry and the resultant solder joint morphology.

Figure 4:
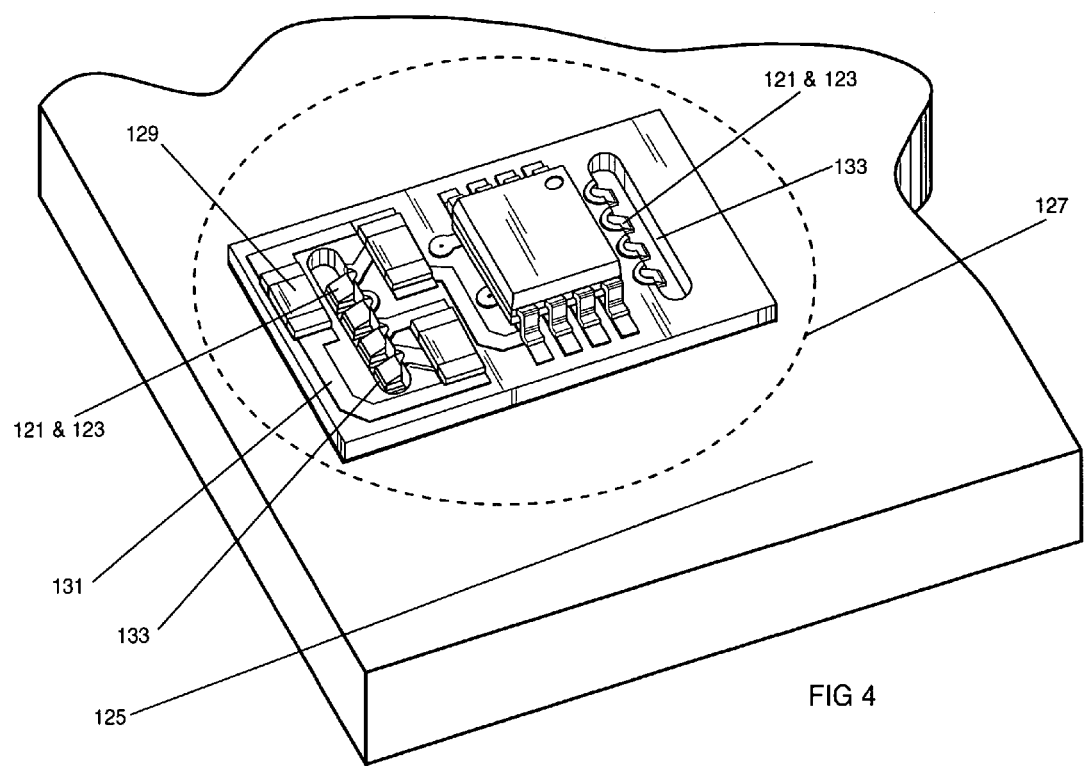
FIG. 4 shows an alternative embodiment of the present invention using partially occluded micro-castellations.

Optional design and construction methods 127 shown in FIG. 4 allow use of partially occluded micro-castellations 133. This design methodology permits use of additional area for routing circuitry 131 and use of additional devices 129. The partially occluded castellations 133 are soldered to the parent printed wiring board 125 surface pads 121, forming robust leadless surface mount solder joints 123.

Figure 5:
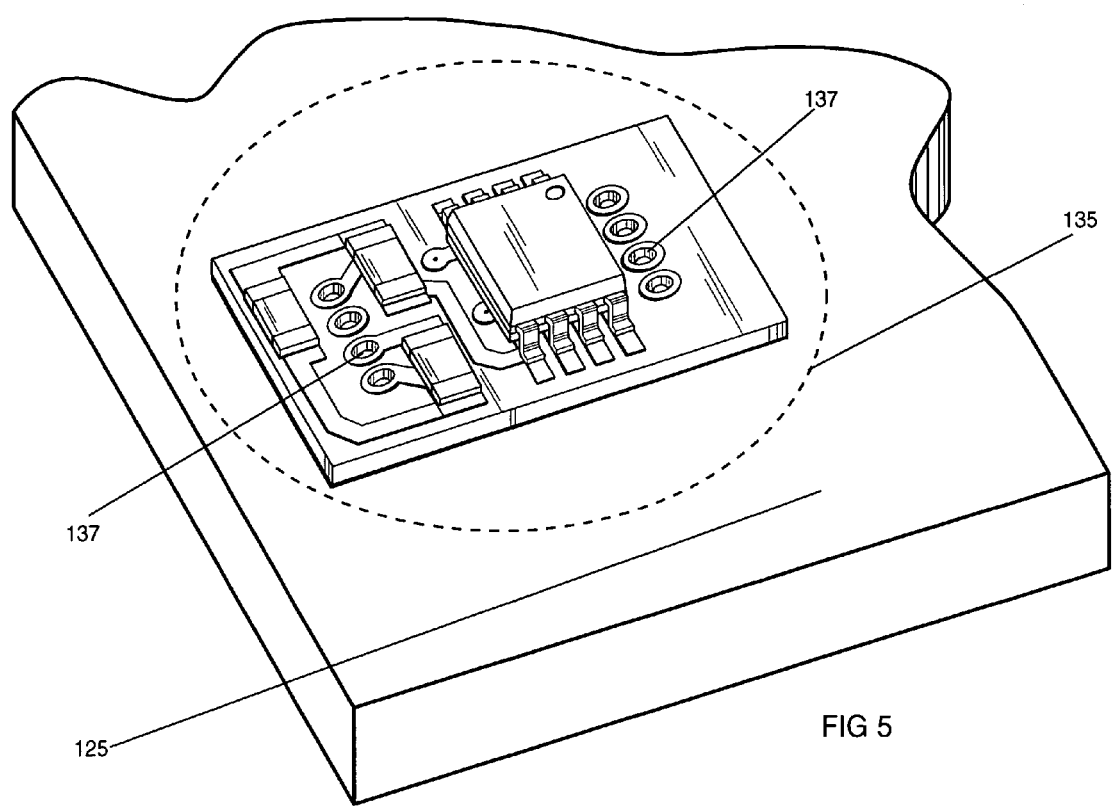
FIG. 5 shows an alternative embodiment of the present invention using fully occluded miro-castellations.

To utilize maximum surface area on the daughter printed wiring board fully occluded micro-castellations 137 may be utilized as in FIG. 5. The fully occluded micro-castellated printed wring board 135 offers maximum board area for a slight reduction in solder joint reliability.

Any of these designs and construction methods can be utilized where the micro-castellations are located anywhere on the micro-castellated printed wiring board, including underneath device bodies and permitting their integration into the device land patterns.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above, are hereby incorporated by reference.

What is claimed is:

1. An apparatus for accommodating circuitry device and interconnect changes externally to a parent printed wiring assembly, the apparatus comprising:
   a micro-castellated printed wiring board, said micro-castellated printed wiring board comprising fine features, the printed wiring board comprising a material whose properties account for a coefficient of expansion differences between the changed circuitry devices and a parent printed wiring board from the parent printed wiring assembly;
   a first interconnection between said fine features and the changed circuitry devices, said first interconnect comprising:
      automated assembly and reflow;
      a robust solder joint, wherein the robust solder joint has a specific geometry based on a pad to a part lead geometry and thermal induced stresses;
      a unique pad geometry for said changed circuitry devices which defines a footprint; and
   a second interconnection between landed castellations of said micro-castellated printed wiring board and the parent printed wiring assembly, the second interconnection including a robust leadless solder joint having a specific geometry based on a pad to castellation geometry ratio and thermal stresses.

2. The apparatus of claim 1 wherein said landed castellations interface directly to parent printed wiring assembly.

3. The apparatus of claim 1 wherein said robust leadless solder joint comprises two distinct soldered zones, a first formed between land patterns comprising a thin structure and a second being formed in the landed castellations which functions as a solder column.

4. The apparatus of claim 1 wherein said landed castellations are formed on an edge of the micro-castellated printed wiring board.

5. The apparatus of claim 1 wherein said landed castellations are formed internal to the micro-castellated printed wiring board comprising partially occluded castellations.

6. The apparatus of claim 1 wherein said landed castellations are formed internal to the micro-castellated printed wiring board comprising fully occluded castellations.

7. The apparatus of claim 1 wherein said second interconnection comprises a means for automated assembly and reflow.

* * * * *

UNITED STATES PATENT AND TRADEMARK OFFICE
CERTIFICATE OF CORRECTION

PATENT NO. : 7,507,914 B2  
APPLICATION NO. : 11/136120  
DATED : March 24, 2009  
INVENTOR(S) : Levine et al.

Page 1 of 1

It is certified that error appears in the above-identified patent and that said Letters Patent is hereby corrected as shown below:

Claim 1, col. 5, line 27, please delete "circuitry device" and subsitute therefore --changed circuitry devices--.

Claim 1, col. 6, line 15, please insert --induced-- before "stresses.".

Signed and Sealed this

Twenty-first Day of April, 2009

JOHN DOLL  
*Acting Director of the United States Patent and Trademark Office*